(12) United States Patent
Buchanan et al.

(10) Patent No.: US 10,187,968 B2
(45) Date of Patent: Jan. 22, 2019

(54) QUASI-RESONANT PLASMA VOLTAGE GENERATOR

(71) Applicants: Walter Riley Buchanan, Olathe, KS (US); Grant William Forsee, Kansas City, MO (US)

(72) Inventors: Walter Riley Buchanan, Olathe, KS (US); Grant William Forsee, Kansas City, MO (US)

(73) Assignee: Ion Inject Technology LLC, Lenexa, KS (US)

( * ) Notice: Subject to any disclaimer, the term of this patent is extended or adjusted under 35 U.S.C. 154(b) by 0 days.

(21) Appl. No.: 15/287,887

(22) Filed: Oct. 7, 2016

(65) Prior Publication Data

US 2018/0014398 A1    Jan. 11, 2018

Related U.S. Application Data

(60) Provisional application No. 62/239,118, filed on Oct. 8, 2015.

(51) Int. Cl.
| | |
|---|---|
| *H05H 1/46* | (2006.01) |
| *H05H 1/00* | (2006.01) |
| *H03H 7/38* | (2006.01) |

(52) U.S. Cl.
CPC .............. *H05H 1/46* (2013.01); *H03H 7/38* (2013.01); *H05H 1/0006* (2013.01); *H05H 2001/4682* (2013.01)

(58) Field of Classification Search
None
See application file for complete search history.

(56) References Cited

U.S. PATENT DOCUMENTS

| | | |
|---|---|---|
| 4,283,291 A | 8/1981 | Lowther |
| 4,399,016 A | 8/1983 | Tsukada |
| 5,311,419 A | 5/1994 | Shires |
| 5,387,842 A | 2/1995 | Roth et al. |
| 5,399,832 A | 3/1995 | Tanisaki et al. |
| 5,414,324 A | 5/1995 | Roth |
| 5,872,426 A | 2/1999 | Kunhardt et al. |
| 5,900,103 A | 5/1999 | Tomoyasu et al. |

(Continued)

OTHER PUBLICATIONS

"International Search Report and Written Opinion", International Application No. PCT/US2016/053919, dated Dec. 23, 2016.

(Continued)

*Primary Examiner* — Douglas W Owens
*Assistant Examiner* — Srinivas Sathiraju
(74) *Attorney, Agent, or Firm* — Law Office of Mark Brown, LLC; Mark E. Brown; Ryan S. Hinderliter

(57) ABSTRACT

Traditional plasma voltage generator circuits consist mainly of fly-back or pulse forming networks. These systems tend supply plasma generating pulses to plasma reactors at frequencies less than 30 kHz with most being less than 5 kHz. In addition these traditional plasma voltage generators are limited in the ability to adjust to dynamic reactor conditions, are energy inefficient and are limited in the amount of material ionized. An innovative drive system is presented herein that is energy efficient, can operate at frequencies below and well above 30 kHz, and can react to dynamic conditions in the plasma reactor allowing much greater flexibility and enhanced operating capabilities.

7 Claims, 3 Drawing Sheets

(56) References Cited

U.S. PATENT DOCUMENTS

| | | | |
|---|---|---|---|
| 5,959,412 A | 9/1999 | Ushijima | |
| 6,005,349 A | 12/1999 | Khnhardt et al. | |
| 6,105,518 A | 8/2000 | Robson et al. | |
| 6,118,218 A | 9/2000 | Yializis et al. | |
| 6,147,452 A | 11/2000 | Kunhardt et al. | |
| 6,170,668 B1 | 1/2001 | Babko-Malyi | |
| 6,208,529 B1 | 3/2001 | Davidson | |
| 6,429,400 B1 | 8/2002 | Sawada | |
| 6,433,480 B1 | 8/2002 | Stark et al. | |
| 6,441,553 B1 | 8/2002 | Yializis | |
| 6,489,585 B1 | 12/2002 | Nakamura et al. | |
| 6,633,109 B2 | 10/2003 | Falkenstein | |
| 6,664,737 B1 | 12/2003 | Berry et al. | |
| 6,773,335 B2 | 8/2004 | Yanobe et al. | |
| 6,818,193 B2 | 11/2004 | Christodoulatos et al. | |
| 6,826,222 B2* | 11/2004 | Hill | H01S 3/2215 315/111.21 |
| 6,853,138 B1 | 2/2005 | Park et al. | |
| 6,946,793 B1 | 9/2005 | Nelson | |
| 7,098,420 B2 | 8/2006 | Crow et al. | |
| 7,215,697 B2* | 5/2007 | Hill | H01S 3/036 372/76 |
| 7,221,102 B2* | 5/2007 | Kotani | H02M 1/32 315/246 |
| 7,273,995 B1 | 9/2007 | Manz et al. | |
| 7,399,944 B2 | 7/2008 | Devries et al. | |
| 7,507,934 B2 | 3/2009 | Kondou et al. | |
| 7,764,140 B2* | 7/2010 | Nagarkatti | H03F 1/56 156/345.28 |
| 8,089,026 B2* | 1/2012 | Sellers | B23K 10/00 204/192.13 |
| 8,093,758 B2 | 1/2012 | Hussman | |
| 8,542,076 B2* | 9/2013 | Maier | H01J 37/32082 333/32 |
| 8,633,782 B2* | 1/2014 | Nagarkatti | H03F 1/56 315/111.21 |
| 8,710,926 B2* | 4/2014 | Nagarkatti | H01J 37/32082 330/254 |
| 9,106,313 B2* | 8/2015 | Ueki | H03H 7/38 |
| 9,287,800 B2 | 3/2016 | Hruska et al. | |
| 9,394,189 B2 | 7/2016 | Buchanan et al. | |
| 9,419,581 B2* | 8/2016 | McKinzie | H03H 7/40 |
| 9,420,679 B2* | 8/2016 | Cheung | H05H 1/30 |
| 9,692,392 B2* | 6/2017 | Cabanillas | H04B 1/0458 |
| 9,698,748 B2* | 7/2017 | Manssen | H01Q 1/242 |
| 9,736,920 B2* | 8/2017 | Smith | H05H 1/46 |
| 2002/0000019 A1 | 1/2002 | Park et al. | |
| 2003/0039297 A1 | 2/2003 | Wittle et al. | |
| 2003/0067273 A1* | 4/2003 | Benjamin | H01J 37/321 315/111.21 |
| 2004/0084382 A1* | 5/2004 | Ryazanova | C01B 13/11 210/748.11 |
| 2004/0094401 A1 | 5/2004 | Carlow | |
| 2004/0183461 A1 | 9/2004 | Kane et al. | |
| 2005/0260354 A1 | 11/2005 | Singh et al. | |
| 2006/0097811 A1 | 5/2006 | Nakamura et al. | |
| 2006/0150911 A1 | 7/2006 | Miyairi et al. | |
| 2006/0208650 A1 | 9/2006 | Kondou | |
| 2008/0060579 A1 | 3/2008 | Hsieh | |
| 2008/0159925 A1 | 7/2008 | Shimizu et al. | |
| 2008/0292497 A1 | 11/2008 | Vangeneugden et al. | |
| 2009/0153279 A1* | 6/2009 | Chen | H05H 11/00 335/210 |
| 2010/0123502 A1* | 5/2010 | Bhutta | H03H 7/18 327/237 |
| 2010/0171428 A1* | 7/2010 | Kirchmeier | H01J 37/32045 315/111.21 |
| 2010/0219757 A1 | 9/2010 | Benzerrouk et al. | |
| 2011/0241798 A1 | 10/2011 | Hong et al. | |
| 2011/0284437 A1 | 11/2011 | Johnson | |
| 2012/0020844 A1 | 1/2012 | Foret | |
| 2012/0250370 A1* | 10/2012 | Taniguchi | H02M 3/33561 363/34 |
| 2012/0262064 A1* | 10/2012 | Nagarkatti | H01J 37/32082 315/111.21 |
| 2014/0178604 A1 | 6/2014 | Selwyn | |
| 2014/0246364 A1 | 9/2014 | Hruska | |
| 2014/0246381 A1* | 9/2014 | Buchanan | C01B 13/115 210/748.19 |
| 2015/0022795 A1* | 1/2015 | Coenen | G03F 7/70033 355/67 |
| 2016/0028311 A1* | 1/2016 | Murakami | H02M 3/156 323/271 |
| 2016/0030910 A1 | 2/2016 | Biberger et al. | |
| 2016/0194224 A1* | 7/2016 | Buchanan | H02M 1/12 204/554 |
| 2016/0197564 A1* | 7/2016 | Buchanan | H02M 1/12 363/123 |

OTHER PUBLICATIONS

"International Search Report and Writter Opinion", PCT/US2014/016730, dated Jul. 4, 2015, pp. 1-18.

* cited by examiner

QUASI-RESONANT PLASMA VOLTAGE GENERATOR

FIELD OF INVENTION

Embodiments of the current invention relate to plasma reactors and the driver electronics utilized to create high electric fields.

BACKGROUND

Plasma reactors may include at least two electrodes which are spaced apart. Typically, a voltage difference is applied to the electrodes and an electric field is established between them. A stream of gas, or multiple streams of different gasses, and or gasses and liquids, gasses and solids or other material or combinations of materials may be introduced to the space between the electrodes such that said materials partially or completely pass through the electric field. Exposure to the electric field generally partially or completely ionizes the gas and other materials between the electrodes and creates a plasma. The systems used to create the electric field which encourages the plasma to form are herein referred to as plasma voltage generators. This novel plasma voltage generator is relevant to many plasma reactors but most relevant to dielectrically isolated plasma reactors.

The plasma voltage generators widely used in the industry are typically transformers driven by high voltages and switched to create a series of high voltage pulses. Other systems are pulse formers which are expensive and generally limited in frequency. All these systems are limited in frequency due to the recovery time of the electronics between pulses and limited in peak voltage by the input voltage and transformer characteristics. High transformer input voltages in excess of 100 volts are normally used in these systems which complicate the voltage control and the transformer drivers. These traditional plasma voltage generators generally create pulses at a frequency below 2 kHz although some may run as high as 30 kHz or higher.

New generation plasma systems need flexible plasma voltage generators which may operate at generally higher frequencies, may have the capability to modify the frequency, peak voltage, power and other operating characteristics to produce varying levels of plasma energy based on outside control factors. In addition, these plasma generators may need to react dynamically to changes in the reactor. For instance, a water remediation system may have heavy loads during peak use times and light loads during other times. In gas or gas/liquid reactors, the reactor may present a variable load to the plasma voltage driver which may need to be accounted for. The plasma voltage generator may need to be able to react to these varying conditions both independently and under the control of a microprocessor and sensor electronics.

In addition, many plasma reactors may have somewhat predictable capacitance which may be used as a circuit element for resonant and quasi-resonant plasma voltage drivers. By using the capacitive nature of the reactor, any changes in this capacitance may be used to monitor, either directly or indirectly, the reaction or condition of the reactor. In addition, since the capacitive nature of the reactor may be used as a circuit element in an inductive capacitive (LC) or other tank circuit, a resonance or partial resonance (herein referred to as quasi-resonance) may be established and used to store energy while a transformer may be used to increase this energy in the tank circuit while being switched on and off at appropriate times.

This novel plasma voltage generator treats the plasma reactor as an electrical circuit element by creating a quasi-resonant resonant oscillation using the transformer and other components in the plasma voltage generator circuit. Plasma reactors, and significantly dielectrically isolated plasma reactors exhibit a capacitive characteristic. This capacitive characteristic allows for the storage of energy in the reactor and associated components which greatly increase the energy efficiency of the plasma voltage generator. In addition, since some of the physical conditions of the reactor while in operation such as pressure, temperature, material flow through the reactor are reflected in the capacitive characteristics of the reactor, the new plasma voltage generator may be designed to sense and react to these changing characteristics in a way beneficial to the overall reaction desired. In addition this novel plasma voltage generator may allow a lower voltage input from the voltage supply, may run at generally higher frequencies, and may be dynamically controllable in peak voltage, frequency, power and other system parameters. This may be accomplished while maintaining the quasi-resonant nature of the drive.

BRIEF SUMMARY OF THE INVENTION

This description assumes the reader has a basic understanding of electronic circuits and more specifically, plasma voltage generators and switch mode power supply circuits.

A first embodiment of this invention may provide a method of generating plasma voltages. In this embodiment, a voltage supply 101, which may or may not be programmable in voltage and current, supplies voltage directly or indirectly to a primary winding of a transformer 102. The transformer 102 conducts electricity when the switch 111 is on, which may be controlled by a switch driver 113, duty cycle controller 112, zero cross detect 106 or turn off timer 107 and either a phase detector 108 or turn on timer 109. The use of a turn off timer 107 or a zero cross detect 106 circuit may depend on the stability of the capacitance of the reactor 105. Both of these circuits may provide the same basic function. This may also be the case with the turn on timer 109 and phase detector 108. The choice of turn on, turn off timers or zero cross and phase detector circuits depend on the overall system needs and plasma reactor stability.

When the switch initially turns on, the switch voltage 115 may be pulled to, or close to, ground and current may start to flow from the voltage supply 101 through transformer 103, this may cause a change in the voltage difference between the terminals of the transformer 102 secondary high side output 122 and low side output 123 causing current to flow through, the optional impedance matching network 104, the plasma reactor 105 and low side output 123 which herein shall be referred to as the transformer secondary loop. This voltage change may transferred to the plasma reactor 105 directly or through the optional impedance matching network 104 and may cause the capacitance in the reactor to begin to gain charge relative to the voltage output from the transformer 103. The voltage may be sufficient to cause ionization of some or all of the material in the plasma reactor 105. It is important to note that the secondary side of transformer 102 or 103 may or may not be electrically isolated from the primary side depending on other system design considerations and all isolated and non-isolated versions are included in this invention.

This voltage may initiate an oscillation in the secondary loop. The optional impedance matching network may be used but is not always required and such circuits are well known by those familiar with plasma voltage generator circuits. This oscillation may be near the natural oscillation frequency of the secondary resonant frequency and can be calculated by those familiar with switching systems. There may be a diode 110 or other device or circuit which only allows significant current flow through said diode while the switch voltage is positive with respect to the drain voltage 116 in series with the switch 111 and there may be a limited or no snubbing circuit on the transformer 103 primary. Due to this circuit configuration the switch voltage 115 may be driven below the supply voltage and close to or below 0V during the on time of the switch 111 by the natural activity of the transformer 102. In an optimum system, the switch may be turned off while switch voltage 115 is near or is below 0V. This may be accomplished by a zero cross detect 106 circuit of which a person familiar with the art may be familiar with, or in some systems, by a simple timer circuit.

Once the switch 111 is turned off the oscillation in the secondary may continue and the switch voltage 115 may return above 0V and may continue to increase above the voltage output of the voltage supply 101.

In the preferred implementation, the switch voltage 115 or the drain voltage 116 may be monitored (herein referred to as the monitored node) by the phase detector 108 and at a point where the voltage at the monitored node may be close to optimum (normally prior to the maximum voltage node 115 will experience if not switched) the switch may be turned on again. The phase detector 108 may also provide a limit to the switch voltage to insure the switch 111 does not experience damage due to an overvoltage condition. In other implementations a second winding on the transformer 103 may be used for this function. There are other methods of monitoring this voltage which are known to those familiar with the art and are included in this invention such as turning on the switch 111 by a simple turn on timer 109 circuit depending on the stability and other needs of the system.

This second switch 111 turn on event results in a second event to the transformer which may result in a larger voltage change on the secondary of the transformer 102. In this manner and on each subsequent on/off transition of the switch 111, the peak voltage on the secondary may increase. This on and off switching is herein referred to as the operation cycle and may be continued either indefinitely or until the peak voltage (or some other parameter such as power into the reactor) may be achieved. Since the transformer 102, the plasma reactor 105, and optional impedance matching network 104 are used, the frequency of this switching may be predictable and is controlled by the electrical characteristics of the circuit. Operating frequencies of up to 5 MHz and above are so achieved. In this manner the plasma reactor may experience an increasing voltage until a voltage capable of causing any material in the reactor to partially or fully ionize is achieved, thus creating an ionized plasma. This on/off switching cycle is herein referred to as the operation cycle.

In some systems the switch driver 113 control may be turned off for a period of time by a duty cycle controller 112, the ionized materials in the plasma reactor may be allowed to relax, herein referred to as the relaxation cycle. A relaxation cycle may be desirable to allow various molecules to form from the plasma created during the operation cycle. The combination of the operation cycle and relaxation cycle is referred to herein as the duty cycle and may be controlled by a duty cycle controller 112. By using various durations of operation and relaxation cycles, the amount of power into the reactor may be modulated and the peak plasma reactor voltage, the amount of energy into the plasma reactor, and other system parameters may be controlled. In addition, it has been demonstrated that the amount of relaxation time may enhance the formation of certain compounds from the ionized material in the plasma reactor. Finally there may be other system performance issues that may be enhanced by various set ups both the operation cycle and the relaxation time.

A second embodiment of the system shows the same system using a turn on timer 109 and turn off timer 107 to determine when to turn the switch 111 on and off. In many systems this may not be possible as the timing is critical and the capacitance of the reactor parameters may be dynamic, but in stable systems, either a turn-on timer 109 or turn off timer 107 or both circuits may be used to simplify the overall system. Various embodiments may include any combination of zero cross detector 106, phase detector 108, turn on timer 109 and turn off timer 107 depending on the plasma rector and desires of the system designer and are included within the scope of this invention.

A third embodiment of the plasma voltage generator demonstrates an alternative method of sensing the phase of the output of the transformer which may be used. In this embodiment a second output winding on the transformer 103 is used by a phase detector 108 and alternative zero cross detection 106 circuit. There are other methods of phase sensing known to those familiar with the art and are included within the scope of this invention.

BRIEF DESCRIPTION OF THE DRAWINGS

Embodiments of the current invention are described in detail below with reference to the attached drawing figures, wherein.

DETAILED DESCRIPTION AND BEST MODE OF IMPLEMENTATION

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the current invention. The following detailed description is, therefore, not to be taken in a limiting sense. The scope of the current invention is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the current technology can include a variety of combinations and/or integrations of the embodiments described herein.

Figure 1:
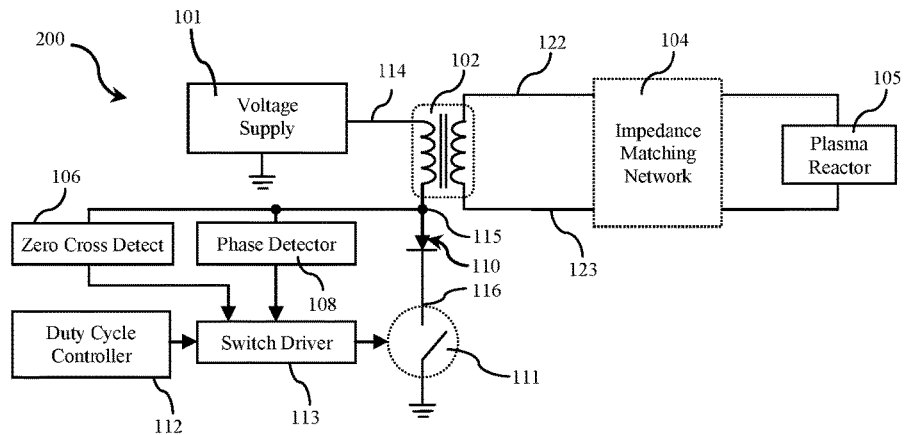
FIG. 1 shows an implementation of this plasma voltage generator.
Figure 2:
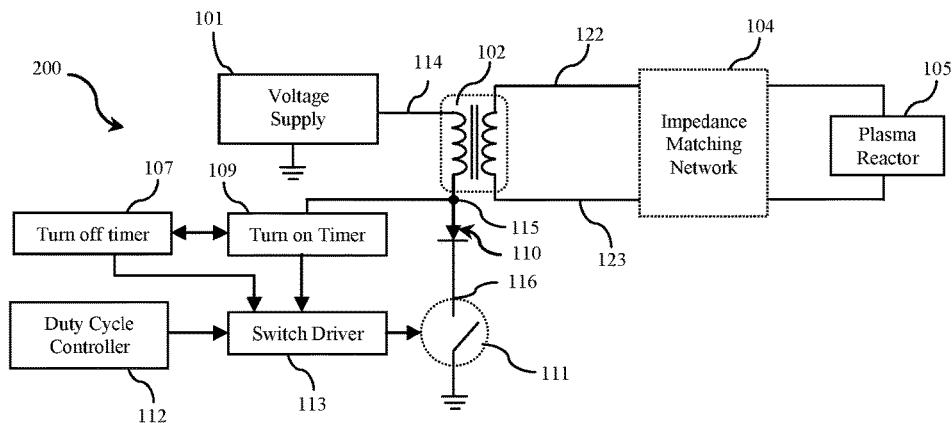
FIG. 2 shows a second implementation of the plasma voltage generator showing the use of an voltage off timer instead of a zero cross detection circuit.
Figure 3:
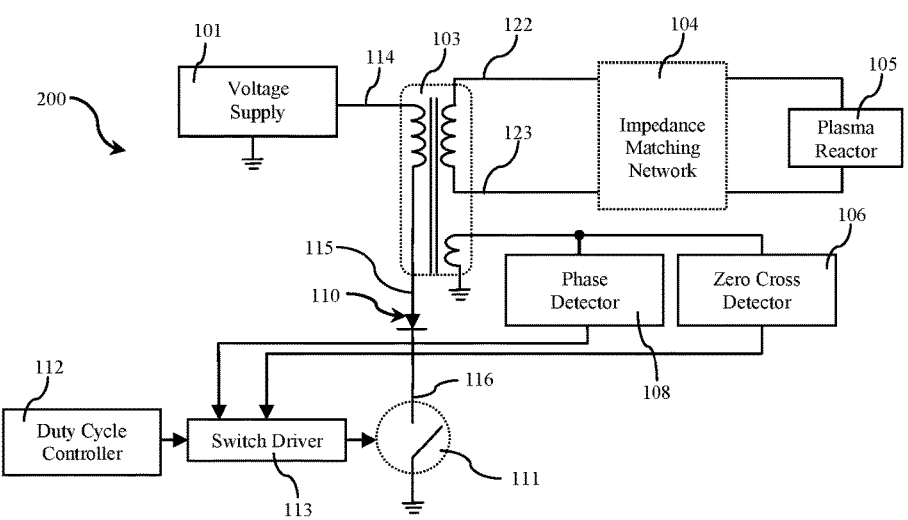
FIG. 3 shows the plasma voltage generator using an isolated winding on the transformer to detect the general timing for this plasma voltage generator circuit.

Referring to FIGS. 1, 2 and 3, a plasma voltage generator consisting of:

A voltage supply 101. This voltage supply may be of a fixed voltage or current type, or may be programmable depending on the needs of the system.

A transformer 102 or 103. This may be a step-up transformer similar in nature used in traditional plasma voltage generator systems.

A blocking diode 110 or other polarity sensitive blocking device or circuit. This may prevent most of the reverse current conduction through the switch 111 while the voltage at node 115 is a lower voltage than ground. In this manner, switching voltage 115 may be allowed to swing positive and negative while the circuit including the transformer oscillates.

A switch 111. This can be any number of devices such as a transistor, a DMOS FET, a thyristor, an IGBT or other switching device known in the electronics industry.

A zero cross detector 106 or alternative turn off timer 107 circuit. In implementations with a zero cross detect 106 circuit, the switching voltage 115 or drain voltage 116 may be monitored and a signal may be provided to the switch driver 113 to turn the switch 111 off when the monitored voltage is close to or below 0 volts. In more stable systems, a turn off timer 107 may be used.

A phase detection circuit 108. This circuit detects the switch voltage 115 or the drain voltage 116 (herein referred to as the monitored voltage as it rises toward a peak which may be caused by the oscillation discussed above. By causing the switch to turn on when the monitored voltage is greater than the supply voltage 101, or at a point where the monitored voltage is close to the peak voltage it will attain on the oscillation cycle, energy may be transferred to the secondary and the secondary voltage may continue to increase. Conversely, the secondary peak voltage can be increased by a smaller amount, held roughly the same or reduced by turning the switch 111 on at other times during this cycle. In an optimum system of this type, the switch 111 may be turned on where the maximum change of the secondary voltage of the transformer 102 or 103 is achieved. In some systems the switch voltage 115 can be high enough to damage the switch 111. In these cases a small circuit can be added to the phase detector to turn the switch on prior to such voltage being achieved thereby protecting the switch 111. In systems that are more stable a turn on timer 109 may be used in place of a phase detector 108.

The zero cross 106 and phase detection 108 circuits can be designed in a number of ways that a person familiar with plasma voltage generators and power supply design are familiar with but serve the same function and are included in this patent.

FIG. 3 shows one such alternative method of sensing the phase in the transformer. This method may be used in systems that have higher input voltages or systems that require isolated sensing for other purposes.

A switch driver 113. This circuit may turn on the switch 111 as determined by the phase detector 108 or turn on timer 109, and turn the switch off as determined by the zero cross detector 106 or turn off timer 107.

A duty cycle controller 112. This is an optional circuit used to regulate the periods of operation and relaxation for the plasma voltage generator 200. In a certain case such as the wave form example in FIG. 5, the duty cycle controller 112 may enable the switch driver 113 for four on/off cycles to create a plasma voltage in a plasma reactor 105, then the duty cycle controller 112 may disable the switch driver 113 for a period of time to allow the ionized material in the plasma reactor 105 to reform into a desired product, then the duty cycle controller 112 repeats this cycle. The duty cycle controller 112 may be connected to a microprocessor or other device capable of determining the on and off times dynamically to optimize a process.

An optional impedance matching network 114. This circuit is not always needed in the system. When needed or desired, the circuit may be as simple as a capacitor or a more complex network depending on the needs of the individual plasma reactor. Impedance matching networks 104 are well known and used throughout the industry.

A plasma reactor 105 which may exhibit a completely or partially capacitive impedance, or a non-capacitive plasma reactor that uses a capacitive element (a impedance matching network 104 in series or parallel or both to form a capacitive, or somewhat capacitive impedance to the secondary of the transformer. There are many different types of plasma reactors and this plasma voltage driver may be applicable to all of them.

There may be several modes of operation which may be mixed dynamically based on the needs of the plasma reactor which is to be driven by the plasma voltage generator. In one mode of operation, a micro-controller (not shown in the drawings) may be used to sense the condition of the reactor effluent such as water in a gas/liquid reactor using water as a liquid and oxygen as a gas to determine the amount of ozone being injected into the water. As the ozone level increases above the desired amount, the micro-controller sends a signal to the duty cycle controller 112 to start increasing the amount of relaxation time (non-switching time) between the generator operation cycles. Alternatively, the number of on pulses during the operational cycle may be reduced or the supply voltage 101 may be reduced. By increasing the relaxation time, or reducing the number of pulses in an operational cycle, or reducing the supply voltage 101, the reactor output is reduced to the desired amount. Conversely, in cases where the ozone is required to be increased, the relaxation time may be reduced or the number of on pulses may be increased, or the supply voltage 101 may be increased. In addition, these controls may also be used to increased or reduced to increase the peak voltage applied to the reactor. These parameters can all be controlled by other system logic including an external controller such as a micro processor.

Referring to FIG. 3. There may be several methods available to those familiar with power supply and plasma voltage generator design for sensing the phase and zero cross timing. FIG. 3 demonstrates another method which can be used when sensor isolation is desirable. In this method a second tap is added to the transformer 103 thus allowing the phase detector circuit to sense the phase using and isolated signal independent of the primary and secondary signals.

Other methods of sensing these signals accomplish largely similar results and are included in this patent.

Figure 4:
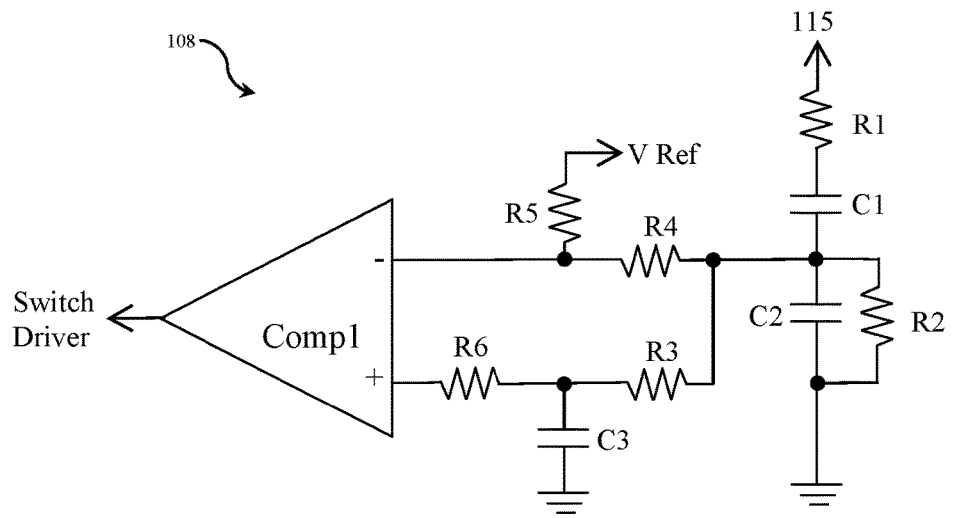
FIG. 4 is a simplified circuit diagram of one embodiment of a phase detector 108.

Referring to FIG. 4. This is a simplified circuit diagram of one embodiment of the phase detector 108. In this circuit, the switch voltage 115 is connected to the resistor R1 and may be partially phase shifted through the capacitors C1 and C2 in parallel with resistor R2. The shifted signal may be connected to R4 and R3. R3 is connected to the positive input of a comparator (comp1) through R6 with a delay caused by capacitor R3 and capacitor C3. R4 is connected to R5 and the negative input of the comparator (comp1). The resistor divider created by R4 and R5 may attenuate the input signal depending on the ratio of values of R4 and R5. The other side of R5 may be connected to a fixed reference voltage, ground, or a variable voltage source. In the case of a connection to ground or a fixed reference voltage or ground, the point where the comparator changes (phase detecting) state may depend on the ratio of R4 to R5 and the reference voltage. In the case of a connection to a variable voltage, such as the analogue output of a micro-controller, the point at which the comparator changes state (phase detecting) may be a function of the ratio of R4 and R5, and may be tuned by the micro-controller over a limited range. In this manner the phase detecting can be fully automatic with an algorithm programmed in a micro-controller designed to optimize the system switching times.

Figure 5:
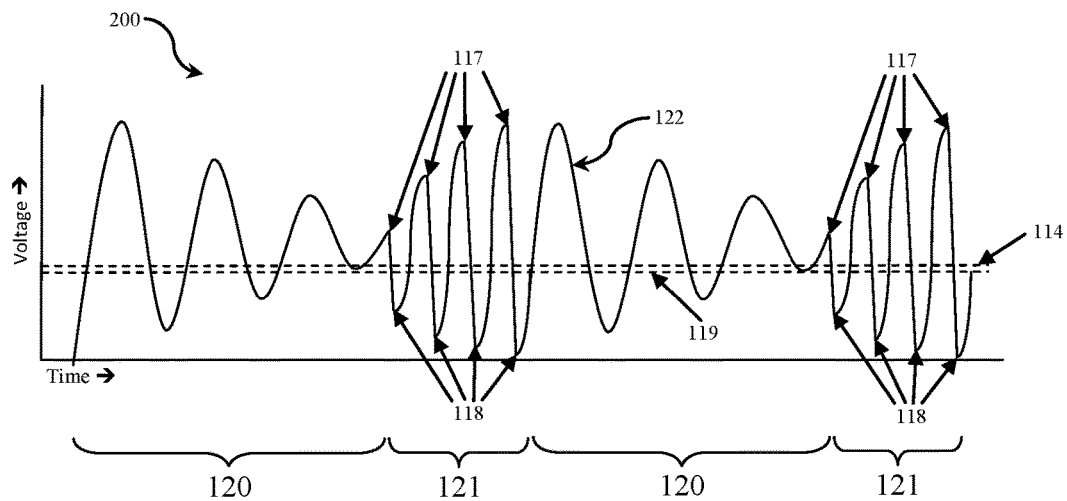
FIG. 5 is a wave form example drawing of the high side voltage 122 with an example showing the various timing aspects. This drawing depicts the voltage on the high side voltage 122 line vs. time.

Referring to FIG. 5 which is an example drawing of secondary voltage 122 with respect to time when the reactor is in operation. This drawing shows the operation cycle when the switch 111 is being turned on and off and the relaxation time. The drawing illustrates one of the preferred points when the switch 111 is turned on and the period where the switch 111 may be turned off.

Figure 6:
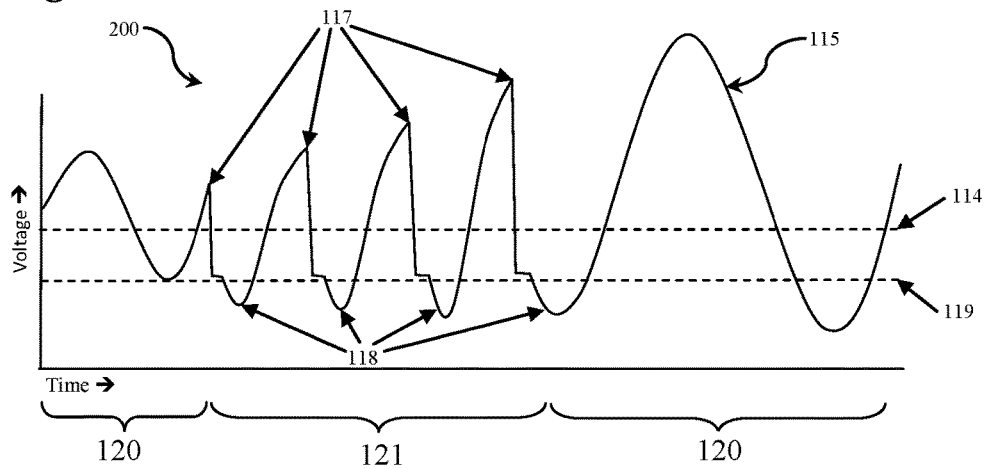
FIG. 6 is a wave form example drawing of the switch voltage 115 with an example showing the various timing aspects. This drawing depicts the voltage on the high side voltage 122 line vs. time.

Referring to FIG. 6 which is an example drawing of the switch voltage 115 when the reactor is in operation. This drawing shows part of the operation cycle when the switch 111 is being turned on and off and the relaxation time. The drawing illustrates one of the preferred points when the switch 111 is turned on and the general period where the switch 111 may be turned off.

Although the invention has been described with reference to the embodiments illustrated in the attached drawing figures, it is noted that equivalents may be employed and substitutions made herein without departing from the scope of the invention as recited in the claims.

Having thus described various embodiments of the invention, what is claimed as new and desired to be protected by Letters Patent includes the following:

1. A method of generating a plasma voltage sufficient to initiate and sustain a plasma in a plasma reactor consisting of the steps of:

providing an electrical power source;

providing a transformer consisting of at least one primary winding and one secondary winding;

connecting said transformer primary winding to said electrical power source;

providing a polarity sensitive device including a blocking diode;

connecting said polarity sensitive device in series with the transformer secondary winding;

providing a switch connected in series with the transformer secondary winding and the polarity sensitive device;

detecting a rising voltage in the transformer secondary winding with a phase detector;

providing a zero cross detection circuit and connecting said zero cross detection circuit to said switch; and opening and closing said switch in response to a zero cross condition detected by said zero cross detection circuit.

2. The method of claim 1, which includes the additional steps of:

providing a switch driver connected to said switch;

providing a duty cycle controller connected to said switch driver; and said duty cycle controller signaling said switch driver and controlling cycles with said switch in a respective open and closed conditions.

3. The method in claim 1, which includes the additional steps of: providing an impedance matching network and connecting said impedance matching network with the plasma reactor.

4. The method of claim 1, which includes the additional steps of: providing a timing circuit in place of the zero cross detector; and selectively closing the switch with the timing circuit.

5. The method of claim 1, which includes the additional steps of: providing a timing circuit in place of the phase detector; and selectively closing the switch with the timing circuit.

6. The method of claim 1, which includes the additional steps of: providing timing control circuits in place of the zero cross detector and the phase detector; and selectively closing the switch with the timing circuits.

7. The method of claim 1, which includes the additional steps of: sensing a value of a switch voltage with the phase detector; and opening the switch in response to a sensed voltage increase.

* * * * *